United States Patent
Homma et al.

(10) Patent No.: US 9,882,571 B2
(45) Date of Patent: Jan. 30, 2018

(54) SEMICONDUCTOR INTEGRATED CIRCUIT

(71) Applicant: SOCIONEXT INC., Yokohama-shi, Kanagawa (JP)

(72) Inventors: Hiroyuki Homma, Akiruno (JP); Kenichi Nomura, Akishima (JP); Ryusuke Obara, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/134,090

(22) Filed: Apr. 20, 2016

(65) Prior Publication Data
US 2016/0233868 A1 Aug. 11, 2016

Related U.S. Application Data

(63) Continuation of application No. PCT/JP2014/079618, filed on Nov. 7, 2014.

(51) Int. Cl.
*H03L 7/093* (2006.01)

(52) U.S. Cl.
CPC .................................. *H03L 7/093* (2013.01)

(58) Field of Classification Search
CPC ...... H03L 7/093; H03L 7/0099; H03L 7/0995
See application file for complete search history.

(56) References Cited

U.S. PATENT DOCUMENTS

| | | | | | |
|---|---|---|---|---|---|
| 4,980,652 A | * | 12/1990 | Tarusawa | ................... | H03L 7/14 331/1 A |
| 5,021,749 A | * | 6/1991 | Kasai | ........................ | H03L 7/10 327/554 |
| 5,389,899 A | * | 2/1995 | Yahagi | ..................... | H03L 1/026 331/10 |
| 5,656,975 A | * | 8/1997 | Imura | ....................... | H03L 7/10 331/11 |
| 6,057,729 A | * | 5/2000 | Nomura | .................. | G06F 1/305 257/E27.046 |
| 6,643,347 B2 | * | 11/2003 | Ohishi | .................... | H03L 7/095 327/156 |
| 7,551,037 B2 | * | 6/2009 | Isobe | ..................... | H03L 7/0802 327/157 |
| 7,595,699 B1 | * | 9/2009 | Schlueter | .............. | H03L 7/0802 331/17 |
| 7,616,066 B2 | * | 11/2009 | Ishii | ......................... | H03L 7/14 327/156 |

(Continued)

FOREIGN PATENT DOCUMENTS

| | | |
|---|---|---|
| JP | H05-129434 A | 5/1993 |
| JP | H10-261781 A | 9/1998 |

(Continued)

OTHER PUBLICATIONS

International Search Report and Written Opinion of the International Searching Authority of International Patent Application No. PCT/JP2014/079618 dated Feb. 10, 2015.

(Continued)

*Primary Examiner* — Thomas J Hiltunen
(74) *Attorney, Agent, or Firm* — Arent Fox LLP

(57) ABSTRACT

A semiconductor integrated circuit includes: a phase locked loop circuit which outputs a clock signal; an internal circuit which executes processing; a capacitor; and a switch circuit which connects the capacitor to either of the phase locked loop circuit and the internal circuit.

18 Claims, 10 Drawing Sheets

(56) References Cited

U.S. PATENT DOCUMENTS

| | | | | |
|---|---|---|---|---|
| 7,755,438 | B2* | 7/2010 | Morikoshi | H03L 7/06 327/50 |
| 8,037,340 | B2* | 10/2011 | Kim | G06F 1/08 713/503 |
| 2005/0062523 | A1* | 3/2005 | Wang | H03J 1/0008 327/554 |
| 2007/0002189 | A1 | 1/2007 | Komatsu et al. | |
| 2010/0141223 | A1 | 6/2010 | Wadhwa | |
| 2015/0303912 | A1* | 10/2015 | Coutts | G06F 1/26 307/29 |

FOREIGN PATENT DOCUMENTS

| | | | |
|---|---|---|---|
| JP | 2007-012938 A | 1/2007 |
| JP | 2007-043554 A | 2/2007 |
| JP | 2007-173478 A | 7/2007 |
| JP | 2012-511785 A | 5/2012 |
| JP | 2012-235048 A | 11/2012 |
| JP | 2013-110254 A | 6/2013 |

OTHER PUBLICATIONS

Japanese Office Action of related Japanese Patent Application No. 2016-524158 dated May 30, 2017.

* cited by examiner

FIG. 11

| INPUT | | | BINARY-TO-DECIMAL CONVERSION | OUTPUT | | | | | | | |
|---|---|---|---|---|---|---|---|---|---|---|---|
| A3 | A2 | A1 | | Z8 | Z7 | Z6 | Z5 | Z4 | Z3 | Z2 | Z1 |
| 0 | 0 | 0 | 00000001 | 0 | 0 | 0 | 0 | 0 | 0 | 0 | 1 |
| 0 | 0 | 1 | 00000010 | 0 | 0 | 0 | 0 | 0 | 0 | 1 | 1 |
| 0 | 1 | 0 | 00000100 | 0 | 0 | 0 | 0 | 0 | 1 | 1 | 1 |
| 0 | 1 | 1 | 00001000 | 0 | 0 | 0 | 0 | 1 | 1 | 1 | 1 |
| 1 | 0 | 0 | 00010000 | 0 | 0 | 0 | 1 | 1 | 1 | 1 | 1 |
| 1 | 0 | 1 | 00100000 | 0 | 0 | 1 | 1 | 1 | 1 | 1 | 1 |
| 1 | 1 | 0 | 01000000 | 0 | 1 | 1 | 1 | 1 | 1 | 1 | 1 |
| 1 | 1 | 1 | 10000000 | 1 | 1 | 1 | 1 | 1 | 1 | 1 | 1 |

F I G. 14

| INPUT | | OUTPUT | | | |
|---|---|---|---|---|---|
| D2 | D1 | E4 | E3 | E2 | E1 |
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

SEMICONDUCTOR INTEGRATED CIRCUIT

CROSS-REFERENCE TO RELATED APPLICATION

This application is a continuation application of International Application PCT/JP2014/079618 filed on Nov. 7, 2014, and designated the U.S., the entire contents of which are incorporated herein by reference.

FIELD

The embodiments discussed herein are directed to a semiconductor integrated circuit.

BACKGROUND

There has been known a semiconductor integrated circuit in which a main block and a peripheral block including a logic circuit are mounted, in a mixed manner, on a semiconductor substrate (refer to Patent Document 1). A main circuit is formed in the main block on the semiconductor substrate, and includes a first trench capacitor. An analog circuit is formed in the peripheral block on the semiconductor substrate, and includes a second trench capacitor. The analog circuit includes at least either a phase locked loop (PLL) or a regulator.

Patent Document 1: Japanese Laid-open Patent Publication No. 2013-110254

An IP (Intellectual Property) core is a circuit of electronic component of functional unit for configuring a semiconductor integrated circuit. The semiconductor integrated circuit is configured by combining various IP cores. The IP core is demanded to achieve not only high performance (speed-up, low power consumption, low noise) but also reduction in size. However, when an inside of the IP core is optimized, a dead space (free space) is sometimes generated in the IP core.

SUMMARY

A semiconductor integrated circuit includes: a phase locked loop circuit which outputs a clock signal; an internal circuit which executes processing; a capacitor; and a switch circuit which connects the capacitor to either of the phase locked loop circuit and the internal circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 is a view illustrating an input-output relation of a converter;

FIG. 14 is a view illustrating an input-output relation of a binary-to-decimal converter in a first selection circuit.

DESCRIPTION OF EMBODIMENTS

Figure 1:
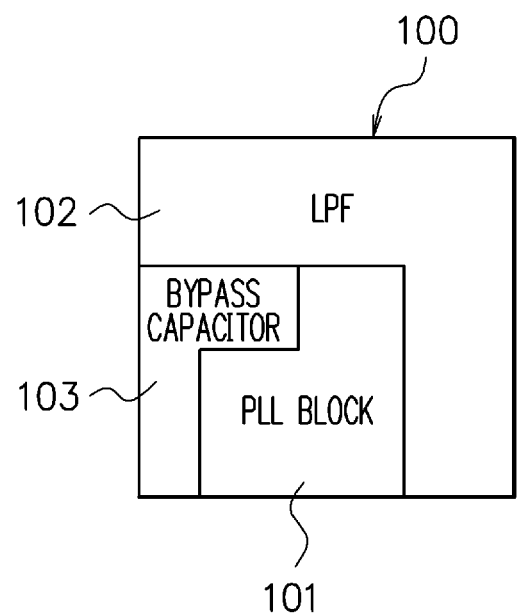
FIG. 1 is a view illustrating an example of layout of a first IP core.

FIG. 1 is a view illustrating an example of layout of a first IP core 100. The first IP core 100 is an IP core of a phase locked loop (PLL) circuit, and includes a PLL block 101, a low-pass filter (LPF) 102, and a bypass capacitor 103. The phase locked loop circuit is a circuit for generating a clock signal. To the PLL block 101, the low-pass filter 102 and the bypass capacitor 103 are connected. The low-pass filter 102 is a capacitor, and performs low-pass filtering on a control signal for controlling a frequency of the clock signal generated by the PLL block 101. The bypass capacitor 103 being a capacitor, is connected between a power supply voltage node of the first IP core (phase locked loop circuit) 100 and a ground potential node, and suppresses variation of power supply voltage caused by noise or the like.

In the first IP core 100, an area occupied by the capacitors of the low-pass filter 102 and the bypass capacitor 103, is relatively large, when compared to an area occupied by the PLL block 101. Even if miniaturization of a transistor in the PLL block 101 is conducted, the area of the capacitors of the low-pass filter 102 and the bypass capacitor 103 does not change almost at all, so that an effect of reducing the area of the first IP core 100 is small.

Figure 2:
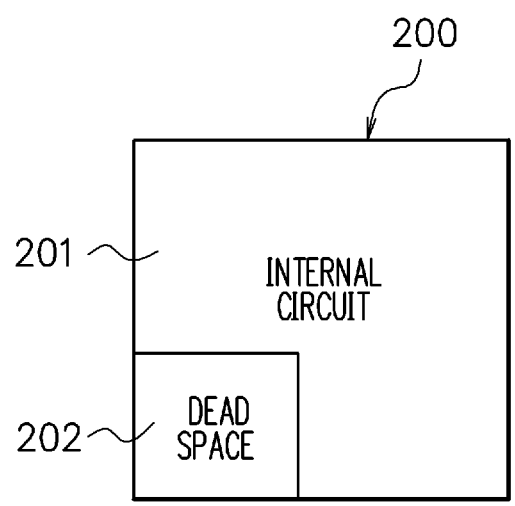
FIG. 2 is a view illustrating an example of layout of a second IP core.

FIG. 2 is a view illustrating an example of layout of a second IP core 200. The second IP core 200 includes an internal circuit 201, and a dead space (free space) 202. The second IP core 200 is an IP core of a processing circuit, and is, for example, an IP core of a high-definition multimedia interface (HDMI (registered trademark)) circuit or a universal serial bus (USB) interface circuit. The internal circuit 201 executes various types of processing. For example, the internal circuit 201 is a HDMI circuit for realizing communication of video or audio digital signals, or a USB interface circuit for realizing communication of digital serial signals. By optimizing an inside of the second IP core 200, the dead space 202 is generated in the second IP core 200.

It is possible to consider that, in the dead space 202, a bypass capacitor for the internal circuit 201 is provided. However, in that case, there is a limit in the effective utilization of the dead space 202, and further effective utilization of the dead space 202 is desired. Hereinafter, embodiments capable of effectively utilizing the dead space 202, will be described.

Figure 3:
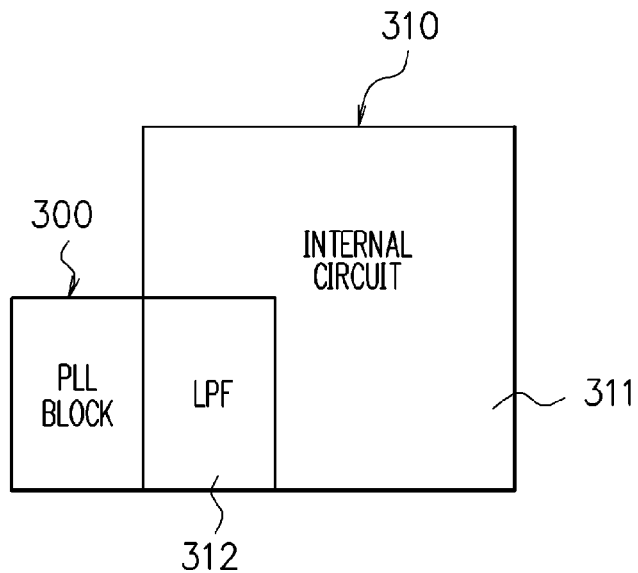
FIG. 3 is a view illustrating a configuration example of a semiconductor integrated circuit according to the present embodiment.

FIG. 3 is a view illustrating a configuration example of a semiconductor integrated circuit according to the present embodiment. The semiconductor integrated circuit includes a first IP core 300, and a second IP core 310. The first IP core 300 is an IP core of a phase locked loop circuit, and includes a PLL block except a low-pass filter. The second IP core 310 is an IP core of a processing circuit, and is, for example, an IP core of a HDMI circuit or a USB interface circuit. The second IP core 310 includes an internal circuit 311 and a low-pass filter 312. The internal circuit 311 executes various types of processing. For example, the internal circuit 311 is a HDMI circuit for realizing communication of video or audio digital signals, or a USB interface circuit for realizing communication of digital serial signals. The low-pass filter 312 is provided in a dead space of the second IP core 310. The dead space corresponds to the dead space 202 in FIG. 2. The low-pass filter 312 is not connected to the internal circuit 311, but is connected to the PLL block of the first IP core 300. The low-pass filter 312 and the PLL block of the first IP core 300 configure a phase locked loop circuit. The low-pass filter 312 is a capacitor, and corresponds to the low-pass filter 102 in FIG. 1. The low-pass filter 312 is not provided in the first IP core 300, but is provided in the dead space in the second IP core 310, and thus the dead space can be effectively utilized. Accordingly, an area of the first IP core 300 becomes smaller than the area of the first IP core 100 in FIG. 1. An area of the semiconductor integrated circuit including the first IP core 300 and the second IP core 310 can be set to be smaller than an area of a semiconductor integrated circuit including the first IP core 100 in FIG. 1 and the second IP core 200 in FIG. 2.

Figure 4:
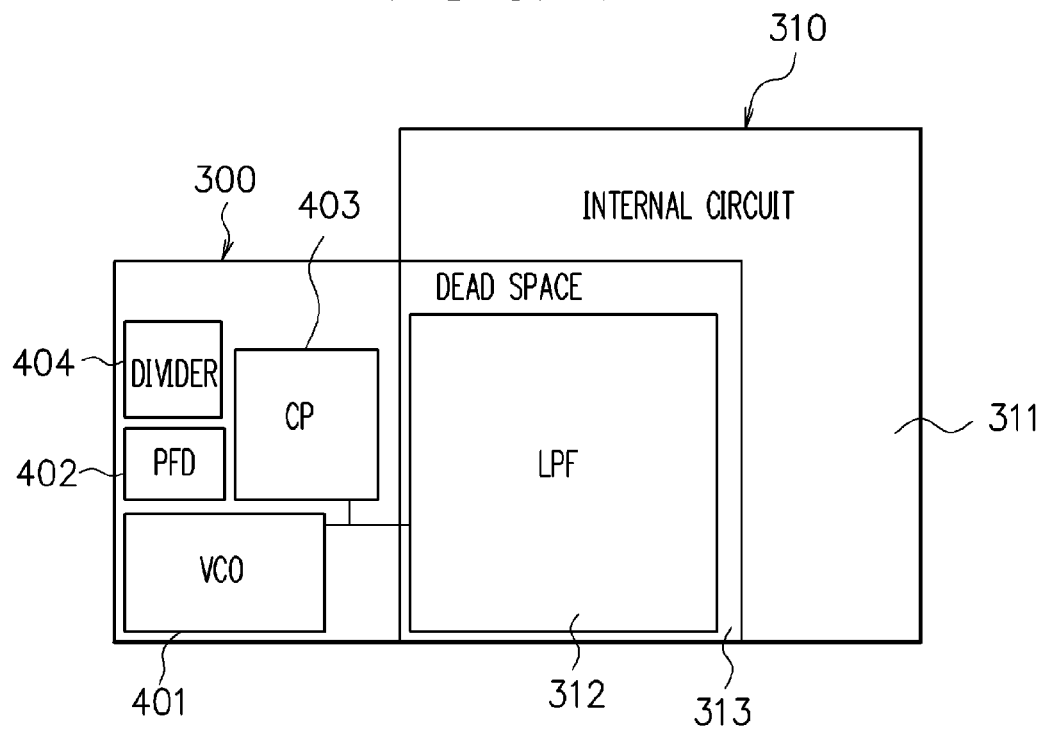
FIG. 4 is a view illustrating a detailed configuration example of the semiconductor integrated circuit in FIG. 3.

FIG. 4 is a view illustrating a detailed configuration example of the semiconductor integrated circuit in FIG. 3. The semiconductor integrated circuit includes the first IP core 300 and the second IP core 310. The second IP core 310 includes the internal circuit 311 and a dead space 313. The dead space 313 corresponds to the dead space 202 in FIG. 2. In the dead space 313, the low-pass filter 312 is provided.

The first IP core 300 includes a voltage-controlled oscillator (VCO) 401, a phase frequency detector (PFD) 402, a charge pump (CP) 403, and a frequency divider 404. To a control voltage terminal of the voltage-controlled oscillator 401, the charge pump 403 is connected. The low-pass filter 312 is connected to the control voltage terminal of the voltage-controlled oscillator 401. The voltage-controlled oscillator 401, the phase frequency detector 402, the charge pump 403, the frequency divider 404, and the low-pass filter 312 configure the phase locked loop circuit.

The voltage-controlled oscillator 401 generates a clock signal with a frequency in accordance with a voltage of the control voltage terminal. The frequency divider 404 divides the frequency of the clock signal generated by the voltage-controlled oscillator 401, and outputs the frequency-divided clock signal. The phase frequency detector 402 detects a phase difference or a frequency difference of the clock signal output from the frequency divider 404 and a reference clock signal. The charge pump 403 includes a switch and a capacitor, performs charge or discharge of electric charges in the capacitor in accordance with a positive or negative sign of the phase difference or the frequency difference detected by the phase frequency detector 402, and outputs the voltage charged in the capacitor to the control voltage terminal of the voltage-controlled oscillator 401. The low-pass filter 312 is a capacitor, and performs low-pass filtering on the voltage of the control voltage terminal of the voltage-controlled oscillator 401. The voltage-controlled oscillator 401 generates a clock signal with a frequency in accordance with the voltage of the control voltage terminal, and outputs, in a feedback manner, the generated clock signal to the frequency divider 404. Through the feedback, the phase and the frequency of the clock signal generated by the voltage-controlled oscillator 401 are controlled so that each of the phase difference and the frequency difference detected by the phase frequency detector 402 becomes 0. The clock signal generated by the voltage-controlled oscillator 401 becomes an output signal of the phase locked loop circuit.

The low-pass filter 312 is the capacitor which needs a relatively large area, so that by providing the low-pass filter 312 in the dead space 313, the area of the first IP core 300 is greatly reduced, when compared to the area of the first IP core 100 in FIG. 1. Accordingly, the area of the semiconductor integrated circuit including the first IP core 300 and the second IP core 310 can be set to be smaller than the area of the semiconductor integrated circuit including the first IP core 100 in FIG. 1 and the second IP core 200 in FIG. 2.

As described above, in FIG. 3 and FIG. 4, the method of making good use of the dead space 313 when the second IP core 310 is connected to the first IP core 300 is described. Next, a method of making good use of the dead space 313 when the second IP core 310 is not connected to the first IP core 300, will be described with reference to FIG. 5 and FIG. 6.

Figure 5:
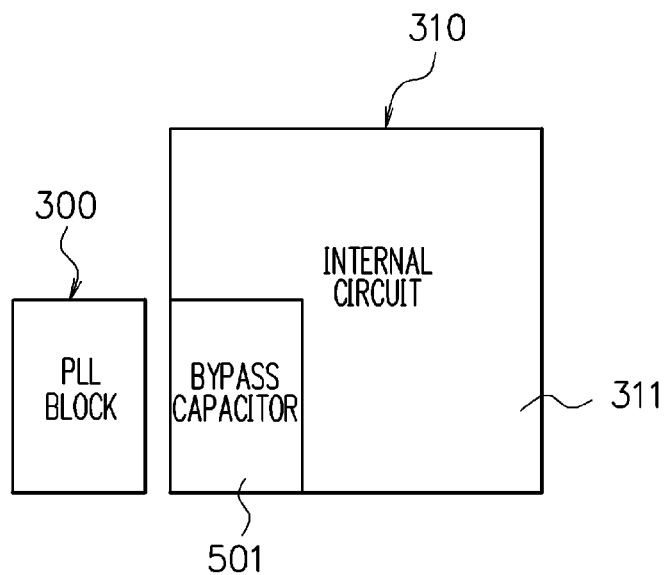
FIG. 5 is a view illustrating another configuration example of the semiconductor integrated circuit according to the present embodiment.

FIG. 5 is a view illustrating another configuration example of the semiconductor integrated circuit according to the present embodiment. The semiconductor integrated circuit includes a first IP core 300 and a second IP core 310. The first IP core 300 and the second IP core 310 are in a state where they are not connected to each other. The first IP core 300 is the same as the first IP core 300 in FIG. 3. The second IP core 310 includes an internal circuit 311 and a bypass capacitor 501. The bypass capacitor 501 is a capacitor, and is provided in a dead space in the second IP core 310. The bypass capacitor 501 is connected between a power supply voltage node of the internal circuit 311 and a ground potential node, and can suppress variation of power supply voltage of the internal circuit 311 caused by noise or the like.

Figure 6:
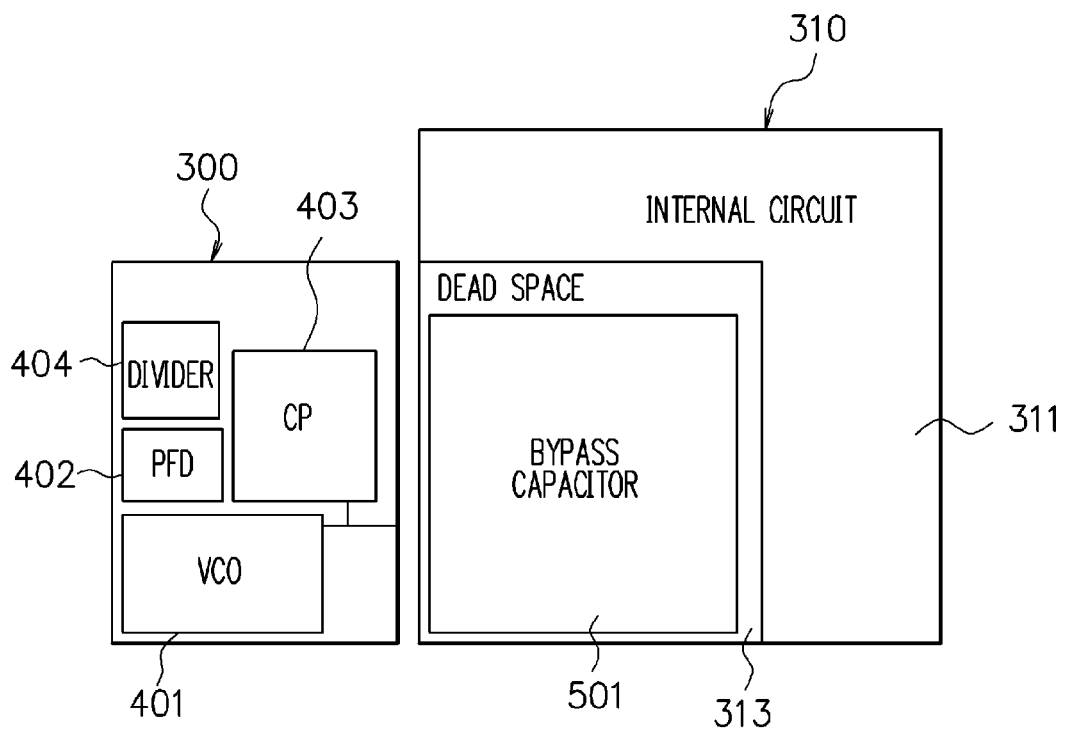
FIG. 6 is a view illustrating a detailed configuration example of the semiconductor integrated circuit in FIG. 5.

FIG. 6 is a view illustrating a detailed configuration example of the semiconductor integrated circuit in FIG. 5. In a similar manner to FIG. 4, the first IP core 300 includes the voltage-controlled oscillator 401, the phase frequency detector 402, the charge pump 403, and the frequency divider 404. In a similar manner to FIG. 4, the second IP core 310 includes the internal circuit 311 and the dead space 313. In the dead space 313, the bypass capacitor 501 is provided. The bypass capacitor 501 is not connected to the first IP core 300, but is connected between the power supply voltage node of the internal circuit 311 and the ground potential node.

The capacitor of the bypass capacitor 501 is physically the same capacitor as the capacitor of the low-pass filter 312 in FIG. 4. Specifically, when the second IP core 310 is connected to the first IP core 300 as illustrated in FIG. 4, by connecting the capacitor in the dead space 313 to the first IP core 300, the capacitor is functioned as the low-pass filter 312. On the other hand, when the second IP core 310 is not connected to the first IP core 300 as illustrated in FIG. 6, by connecting the capacitor in the dead space 313 to the internal circuit 311, the capacitor is functioned as the bypass capacitor 501. As described above, the application of the capacitor in the dead space 313 is changed according to whether or not the first IP core 300 and the second IP core 310 are connected to each other. Consequently, it is possible to effectively utilize the dead space 313.

Figure 7:
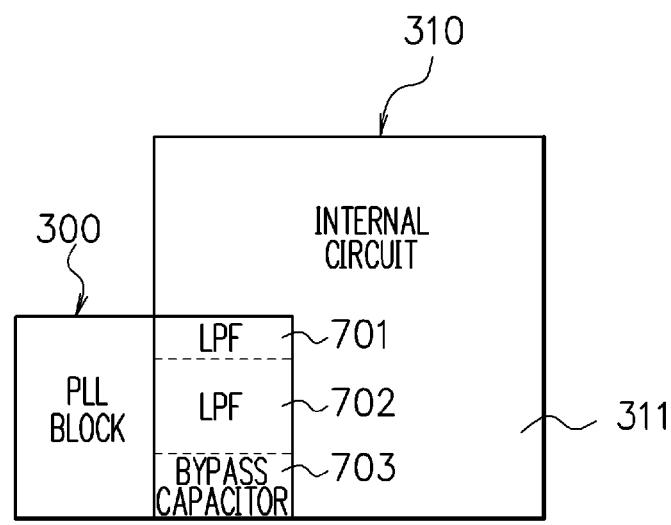
FIG. 7 is a view illustrating a configuration example of a semiconductor integrated circuit according to another embodiment.

FIG. 7 is a view illustrating a configuration example of a semiconductor integrated circuit according to another embodiment. The semiconductor integrated circuit in FIG. 7 corresponds to the semiconductor integrated circuit in FIG. 3 in which a first low-pass filter 701, a second low-pass filter 702, and a bypass capacitor 703 are provided, instead of the low-pass filter 312. Hereinafter, description will be made on a point at which FIG. 7 differs from FIG. 3.

The first low-pass filter 701, the second low-pass filter 702, and the bypass capacitor 703 are provided in a dead space in the second IP core 310. The first low-pass filter 701 is a capacitor, and when it is connected to the first IP core 300, it can be functioned as a primary low-pass filter of a phase locked loop circuit. The second low-pass filter 702 is a capacitor, and when it is connected to the first IP core 300, it can be functioned as a secondary low-pass filter of the phase locked loop circuit. The secondary low-pass filter has a filtering characteristic different from that of the primary low-pass filter. The bypass capacitor 703 is a capacitor, and when it is connected to the first IP core 300, it can be functioned as a bypass capacitor of the phase locked loop circuit.

Figure 8:
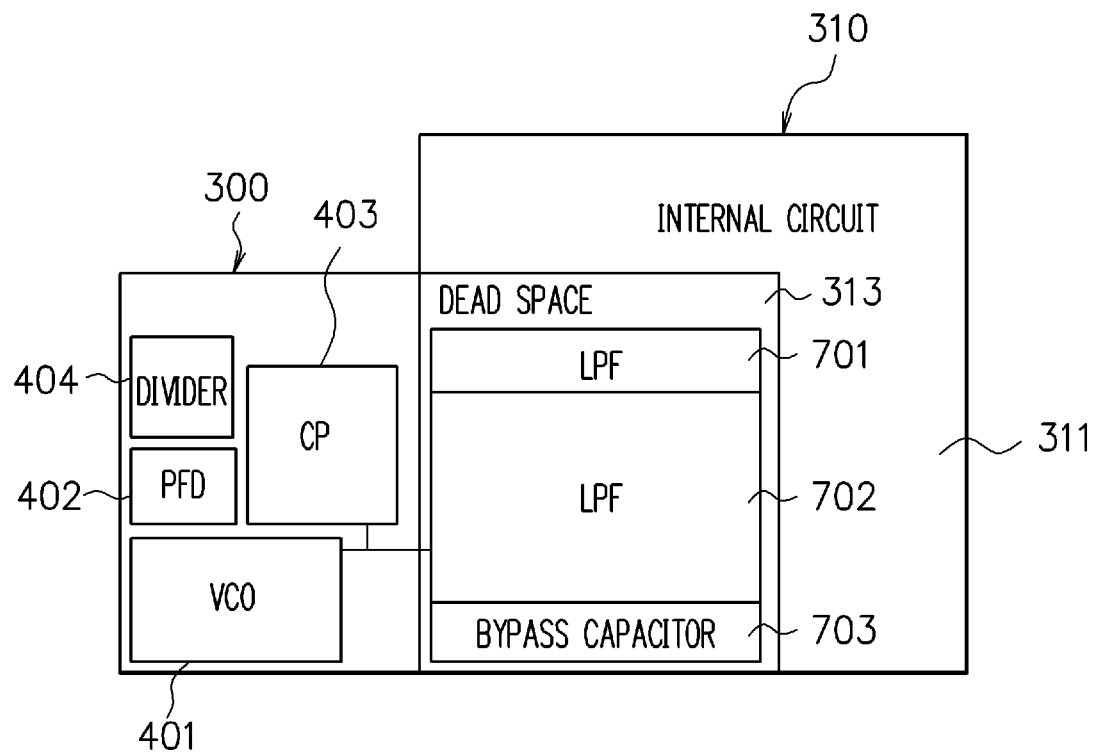
FIG. 8 is a view illustrating a detailed configuration example of the semiconductor integrated circuit in FIG. 7.

FIG. 8 is a view illustrating a detailed configuration example of the semiconductor integrated circuit in FIG. 7. In a similar manner to FIG. 4, the first IP core 300 includes the voltage-controlled oscillator 401, the phase frequency detector 402, the charge pump 403, and the frequency divider 404. In a similar manner to FIG. 4, the second IP core 310 includes the internal circuit 311 and the dead space 313. In the dead space 313, the first low-pass filter 701, the second low-pass filter 702, and the bypass capacitor 703 are provided.

The first low-pass filter 701 functions as the primary low-pass filter of the phase locked loop circuit when it is connected to the control voltage terminal of the voltage-controlled oscillator 401, and can perform primary low-pass filtering on a voltage of the control voltage terminal of the voltage-controlled oscillator 401.

The second low-pass filter 702 functions as the secondary low-pass filter of the phase locked loop circuit when it is connected to the control voltage terminal of the voltage-controlled oscillator 401, and can perform secondary low-pass filtering on the voltage of the control voltage terminal of the voltage-controlled oscillator 401.

The bypass capacitor 703 functions as the bypass capacitor of the phase locked loop circuit when it is connected between the power supply voltage node of the first IP core (phase locked loop circuit) and the ground potential node, and can suppress variation of power supply voltage of the phase locked loop circuit caused by noise or the like.

As described above, the capacitor in the dead space 313 can be divided into the first low-pass filter 701, the second low-pass filter 702, and the bypass capacitor 703, and can be used for different applications.

Figure 9:
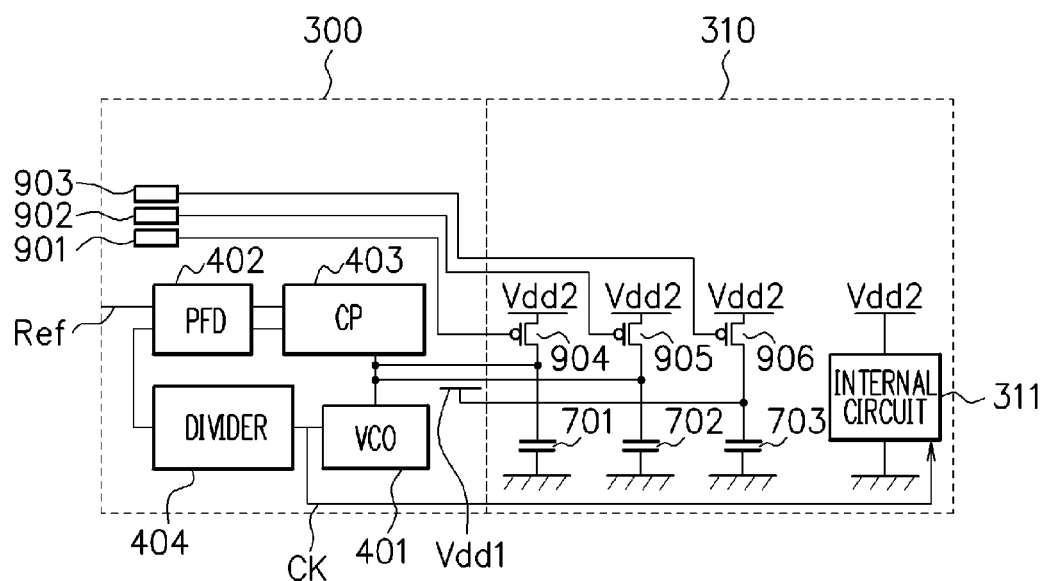
FIG. 9 is a view illustrating a configuration example of a semiconductor integrated circuit according to another embodiment.

FIG. 9 is a view illustrating a configuration example of a semiconductor integrated circuit according to another embodiment. Hereinafter, a point at which FIG. 9 differs from FIG. 8 will be described. First, a case where the second IP core 310 is connected to the first IP core 300 as illustrated in FIG. 9, will be described.

The first IP core 300 includes switches 901 to 903, other than the voltage-controlled oscillator 401, the phase frequency detector 402, the charge pump 403, and the frequency divider 404. Each of the switches 901 to 903 outputs a fixed level of high level.

The second IP core 310 includes p-channel field-effect transistors 904 to 906, other than the internal circuit 311, the first low-pass filter (capacitor) 701, the second low-pass filter (capacitor) 702, and the bypass capacitor (capacitor) 703. The internal circuit 311 is connected between a power supply voltage node Vdd2 and a ground potential node, and operates by receiving supply of power supply voltage from the power supply voltage node Vdd2.

The p-channel field-effect transistor 904 has a source connected to the power supply voltage node Vdd2, a gate connected to an output terminal of the switch 901, and a drain connected to the first low-pass filter 701. Since the switch 901 outputs the high level, the p-channel field-effect transistor 904 is turned off. As a result of this, the first low-pass filter 701 is connected between the control voltage terminal of the voltage-controlled oscillator 401 and the ground potential node.

The p-channel field-effect transistor 905 has a source connected to the power supply voltage node Vdd2, a gate connected to an output terminal of the switch 902, and a drain connected to the second low-pass filter 702. Since the switch 902 outputs the high level, the p-channel field-effect transistor 905 is turned off. As a result of this, the second low-pass filter 702 is connected between the control voltage terminal of the voltage-controlled oscillator 401 and the ground potential node.

The p-channel field-effect transistor 906 has a source connected to the power supply voltage node Vdd2, a gate connected to an output terminal of the switch 903, and a drain connected to the bypass capacitor 703. Since the switch 903 outputs the high level, the p-channel field-effect transistor 906 is turned off. As a result of this, the bypass capacitor 703 is connected between a power supply voltage node Vdd1 of the first IP core (phase locked loop circuit) 300 and the ground potential node. Accordingly, the bypass capacitor 703 functions as the bypass capacitor of the phase locked loop circuit.

Next, an operation of the phase locked loop circuit will be described. The voltage-controlled oscillator 401 generates a clock signal CK with a frequency in accordance with a voltage of the control voltage terminal. The frequency divider 404 divides the frequency of the clock signal CK generated by the voltage-controlled oscillator 401, and outputs the frequency-divided clock signal. The phase frequency detector 402 detects a phase difference or a frequency difference of the clock signal output from the frequency divider 404 and a reference clock signal Ref. The charge pump 403 includes a switch and a capacitor, performs charge or discharge of electric charges in the capacitor in accordance with a positive or negative sign of the phase difference or the frequency difference detected by the phase frequency detector 402, and outputs the voltage charged in the capacitor to the control voltage terminal of the voltage-controlled oscillator 401. The first low-pass filter 701 and the second low-pass filter 702 perform low-pass filtering on the voltage of the control voltage terminal of the voltage-controlled oscillator 401. The voltage-controlled oscillator 401 generates a clock signal CK with a frequency in accordance with the voltage of the control voltage terminal, and outputs, in a feedback manner, the generated clock signal CK to the frequency divider 404. Through the feedback, the phase and the frequency of the clock signal generated by the voltage-controlled oscillator 401 are controlled so that each of the phase difference and the frequency difference detected by the phase frequency detector 402 becomes 0. Further, the voltage-controlled oscillator 401 outputs the clock signal CK to the internal circuit 311 as an output signal of the phase locked loop circuit. The internal circuit 311 operates in synchronization with the clock signal CK.

Next, description will be made on a case of use in which the second IP core 310 is in a state of being disconnected to the first IP core 300. In that case, the gates of the p-channel field-effect transistors 904 to 906 are in a state of being disconnected to the switches 901 to 903, respectively. Further, each of the first low-pass filter 701 and the second low-pass filter 702 is in a state of being disconnected to the control voltage terminal of the voltage-controlled oscillator 401. Each of the gates of the p-channel field-effect transistors 904 to 906 is connected to a node at low level, and the p-channel field-effect transistors 904 to 906 are turned on. As a result of this, the capacitors 701 to 703 are connected in parallel between the power supply voltage node Vdd2 of the internal circuit 311 and the ground potential node, and function as the bypass capacitor of the internal circuit 311, in a similar manner to FIG. 5 and FIG. 6.

As described above, the p-channel field-effect transistors 904 to 906 configure a switch circuit, and connect the capacitors 701 to 703 to either of the first core (phase locked loop circuit) 300 and the power supply voltage node Vdd2 of the internal circuit 311.

The p-channel field-effect transistors 904 and 905 are first switch elements, and when a first switch control signal is in a first state, they connect the capacitors (first capacitor elements) 701 and 702 to the power supply voltage node Vdd2 of the internal circuit 311 as the bypass capacitor. Further, when the first switch control signal is in a second state, the p-channel field-effect transistors 904 and 905 connect the capacitors 701 and 702 to the control voltage terminal of the voltage-controlled oscillator 401 as the low-pass filter.

The p-channel field-effect transistor 906 is a second switch element, and when a second switch control signal is in a third state, it connects the capacitor (second capacitor element) 703 to the power supply voltage node Vdd2 of the internal circuit 311 as the bypass capacitor. Further, when the second switch control signal is in a fourth state, the p-channel field-effect transistor 906 connects the capacitor 703 to the power supply voltage node Vdd1 of the phase locked loop circuit as the bypass capacitor.

Figure 10:
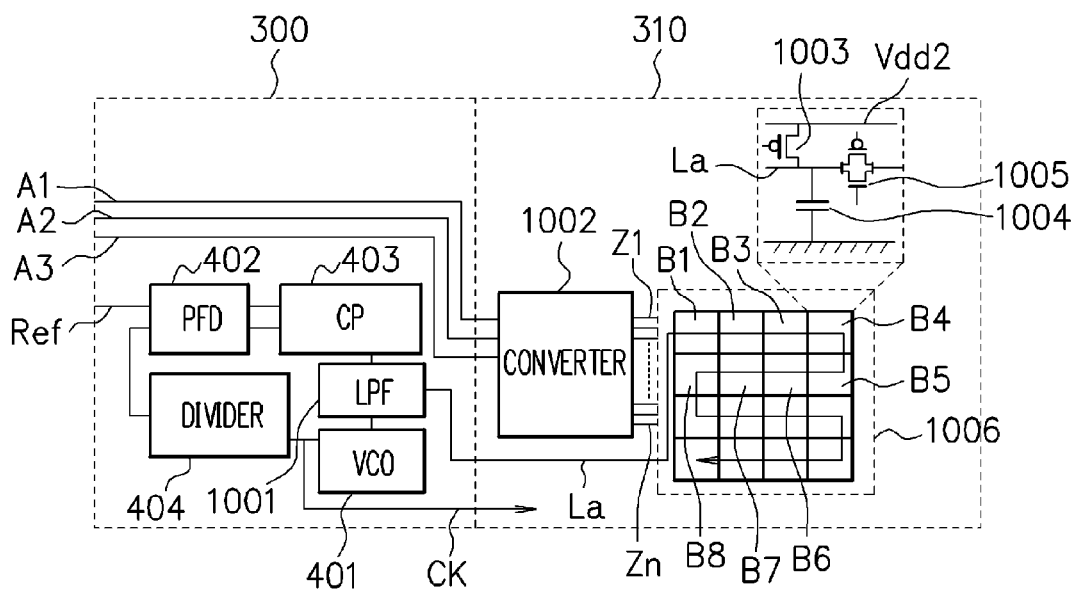
FIG. 10 is a view illustrating a configuration example of a semiconductor integrated circuit according to another embodiment.

FIG. 10 is a view illustrating a configuration example of a semiconductor integrated circuit according to another embodiment. The semiconductor integrated circuit includes a first IP core 300 and a second IP core 310. The first IP core 300 corresponds to the first IP core 300 in FIG. 9 in which control lines A1 to A3 are provided, instead of the switches 901 to 903. Further, the first IP core 300 further includes a low-pass filter 1001. The low-pass filter 1001 is provided between the charge pump 403 and the control voltage terminal of the voltage-controlled oscillator 401, and includes a capacitor for fine adjustment.

The second IP core 310 includes, other than the internal circuit 311, a converter 1002, and a capacitor block group 1006 in a dead space. The converter 1002 inputs input signals of the control lines A1 to A3 therein, and outputs output signals to output lines Z1 to Zn.

FIG. 11 is a view illustrating an input-output relation of the converter 1002, and illustrates an example of 3-bit input and 8-bit output. The converter 1002 performs binary-to-decimal conversion on the input signals of the control lines A1 to A3, and generates signals of output lines Z1 to Z8 based on the converted signal. For example, when an input signal is "000", an output signal becomes "00000001". When the input signal is "001", the output signal becomes "00000011". When the input signal is "010", the output signal becomes "00000111". As the input signal becomes large, a bit number of "1" of the output signal increases. Further, in the output signal, each of bits continued from a least significant bit becomes "1".

In FIG. 10, the capacitor block group 1006 includes a plurality of capacitor blocks B1 to Bn arranged in a two-dimensional matrix form, and is connected to a line La of the low-pass filter 1001. The line La is sequentially wired, within the plurality of capacitor blocks B1 to Bn in the two-dimensional matrix form, in a serial manner and in a chain state, from the capacitor block B1 to the capacitor block Bn.

Each of the capacitor blocks B1 to Bn includes a p-channel field-effect transistor 1003, a capacitor element 1004, and a CMOS switch 1005. The capacitor element 1004 has a capacitance value of 1 [pF], for example, and is connected between the line La and the ground potential node. The p-channel field-effect transistor 1003 has a source connected to the power supply voltage node Vdd2 of the internal circuit 311, and a drain connected to the line La. The CMOS switch 1005 in the capacitor block B4 is connected between the line La in the capacitor block B3 positioned in front of the capacitor block B4 and the line La in the capacitor block B5 positioned behind the capacitor block B4.

The p-channel field-effect transistors 1003 and the CMOS switches 1005 in the capacitor blocks B1 to Bn are turned on or off in accordance with the output signals of the output lines Z1 to Zn, respectively.

When the signal of the output line Z1 is "1", and each of the signals of the output lines Z2 to Zn is "0", the p-channel field-effect transistor 1003 in the capacitor block B1 is turned off, the CMOS switches 1005 in the capacitor blocks B1 to Bn are turned off, and the p-channel field-effect transistors 1003 in the capacitor blocks B2 to Bn are turned on. As a result of this, the capacitor element 1004 in the capacitor block B1 is connected to the low-pass filter 1001, and functions as the low-pass filter of the phase locked loop circuit. The capacitor elements 1004 in the capacitor blocks B2 to Bn are connected between the power supply voltage node Vdd2 and the ground potential node, and function as the bypass capacitor of the internal circuit 311.

When each of the signals of the output lines Z1 and Z2 is "1", and each of the signals of the output lines Z3 to Zn is "0", the p-channel field-effect transistors 1003 in the capacitor blocks B1 and B2 are turned off, the CMOS switch 1005 in the capacitor block B1 is turned on, the CMOS switches 1005 in the capacitor blocks B2 to Bn are turned off, and the p-channel field-effect transistors 1003 in the capacitor blocks B3 to Bn are turned on. As a result of this, the capacitor elements 1004 in the capacitor blocks B1 and B2 are connected to the low-pass filter 1001, and function as the low-pass filter of the phase locked loop circuit. The capacitor elements 1004 in the capacitor blocks B3 to Bn are connected between the power supply voltage node Vdd2 and the ground potential node, and function as the bypass capacitor of the internal circuit 311.

In like manner, when each of the signals of the output lines Z1 to Z3 is "1", and each of the signals of the output lines Z4 to Zn is "0", the capacitor elements 1004 in the capacitor blocks B1 to B3 are connected to the low-pass filter 1001 of the phase locked loop circuit. The capacitor elements 1004 in the capacitor blocks B4 to Bn are connected to the power supply voltage node Vdd2 of the internal circuit 311 as the bypass capacitor.

As described above, the p-channel field-effect transistors 1003 and the CMOS switches 1005 in the capacitor blocks B1 to Bn configure the switch circuit, which connects continuous plural capacitor elements 1004 out of the capacitor elements 1004 in the plurality of capacitor blocks B1 to Bn to the low-pass filter 1001 of the phase locked loop circuit in a chain state, and connects the rest of the capacitor elements 1004 to the power supply voltage node Vdd2 of the internal circuit 311, in accordance with the switch control signals of the output lines Z1 to Zn. As the signals of the control lines A1 to A3 become large, the number of capacitor elements 1004 to be connected to the low-pass filter 1001 increases, resulting in that the capacitance value of the low-pass filter of the phase locked loop circuit increases. By the signals of the control lines A1 to A3 from the exterior, the capacitor elements 1004 in the plurality of capacitor blocks B1 to Bn are assigned as the above-described low-pass filter or bypass capacitor.

Note that it is also possible to design such that the capacitor element 1004 is connected to, not the low-pass filter 1001, but the power supply voltage node Vdd1 of the phase locked loop circuit.

Figure 12:
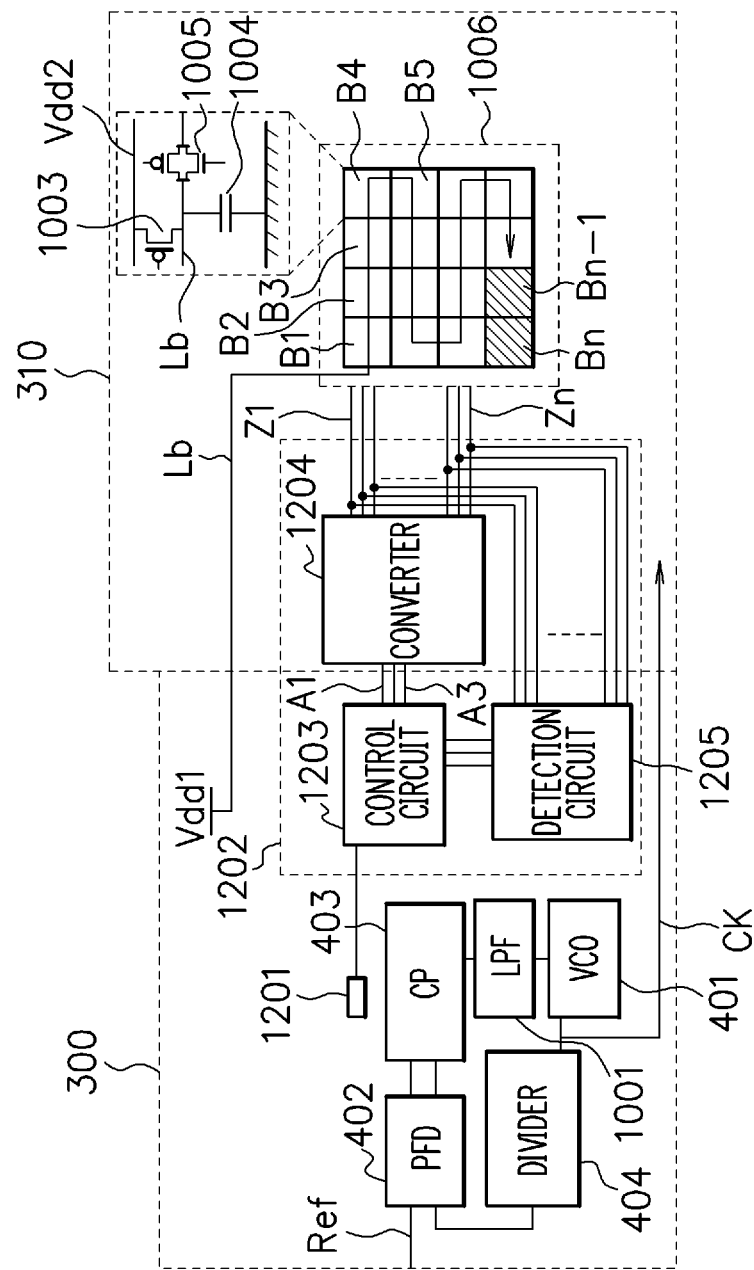
FIG. 12 is a view illustrating a configuration example of a semiconductor integrated circuit according to another embodiment.

FIG. 12 is a view illustrating a configuration example of a semiconductor integrated circuit according to another embodiment. The semiconductor integrated circuit includes a first IP core 300 and a second IP core 310. Hereinafter, a point at which FIG. 12 differs from FIG. 10 will be described. The first IP core 300 includes, other than the voltage-controlled oscillator 401, the phase frequency detector 402, the charge pump 403, the frequency divider 404, and the low-pass filter 1001, a switch 1201, a control circuit 1203, and a detection circuit 1205.

The second IP core 310 includes a capacitor block group 1006 and a converter 1204. A line Lb is connected to the power supply voltage node Vdd1 of the first IP core (phase locked loop circuit) 300. The capacitor block group 1006 has a configuration same as that of the capacitor block group 1006 in FIG. 10, and is connected to the line Lb of the power supply voltage node Vdd1, instead of the line La of the low-pass filter 1001 as in the capacitor block group 1006 in FIG. 10. The converter 1204 has a configuration similar to that of the converter 1002 in FIG. 10.

The capacitor block group 1006 includes capacitor blocks B1 to Bn. Signals of output lines Zn-1 and Zn of the converter 1204 are fixed to "0", regardless of signals of control lines A1 to A3. As a result of this, in the capacitor blocks Bn-1 and Bn, the p-channel field-effect transistors 1003 are turned on, and the capacitor elements 1004 are fixedly connected to the power supply voltage node Vdd2 of the internal circuit 311. Specifically, the capacitor elements 1004 in the capacitor blocks Bn-1 and Bn are uncontrollable capacitor elements which are fixedly connected to the power supply voltage node Vdd2 of the internal circuit 311. On the contrary, the capacitor elements 1004 in the capacitor blocks B1 to Bn-2 are capacitor elements whose connection destination can be controlled in accordance with signals of the output lines Z1 to Zn-2.

When the power of the semiconductor integrated circuit is turned on, the power of the detection circuit 1205 is first turned on, and the power of the control circuit 1203 is kept off. In this case, the converter 1204 outputs switch control signals of the output lines Z1 to Zn in an initial state. In the initial state, the switch control signal of each of the output lines Z1 to Zn-2 is "1", and the switch control signal of each of the output lines Zn-1 and Zn is "0". The detection circuit 1205 detects, based on the switch control signals of the output lines Z1 to Zn in the initial state, the number of controllable capacitor elements 1004 in the capacitor blocks B1 to Bn-2, and the number of uncontrollable capacitor elements 1004 in the capacitor blocks Bn-1 and Bn, and outputs the number of controllable capacitor elements 1004 in the capacitor blocks B1 to Bn-2 to the control circuit 1203.

Next, the power of the control circuit 1203 is turned on. The switch 1201 outputs a ratio control signal to the control circuit 1203. The control circuit 1203 outputs the signals of the control lines A1 to A3 to make the capacitor element 1004 whose number corresponds to the ratio designated by the switch 1201, out of the number of the controllable capacitor elements 1004 detected by the detection circuit 1205, connect to the power supply voltage node Vdd1 of the phase locked loop circuit, and to make the rest of the capacitor elements 1004 connect to the power supply voltage node Vdd2 of the internal circuit 311. Consequently, the p-channel field-effect transistors 1003 and the CMOS switches 1005 in the capacitor blocks B1 to Bn connect the capacitor element 1004 whose number corresponds to the ratio designated by the switch 1201, out of the number of the controllable capacitor elements 1004 detected by the detection circuit 1205, to the power supply voltage node Vdd1 of the phase locked loop circuit, and connect the rest of the capacitor elements 1004 to the power supply voltage node Vdd2 of the internal circuit 311.

A control block 1202 includes the control circuit 1203, the converter 1204, and the detection circuit 1205. Although the control block 1202 is disposed in the first IP core 300 and the second IP core 310 in a separate manner, it may also be disposed in either of the first IP core 300 and the second IP core 310.

Note that it is also possible to design such that the capacitor elements 1004 are connected to the low-pass filter 1001, instead of the power supply voltage node Vdd1.

Figure 13:
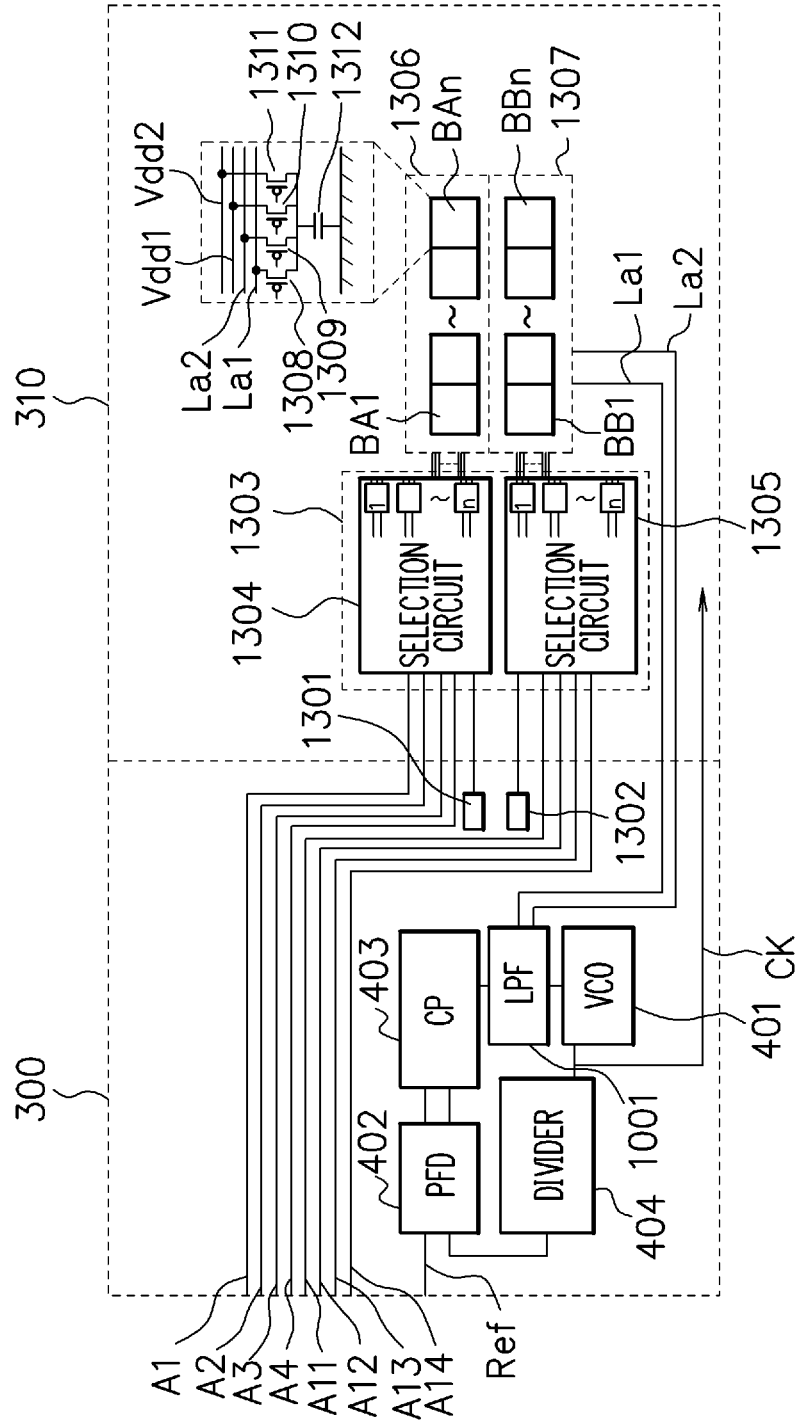
FIG. 13 is a view illustrating a configuration example of a semiconductor integrated circuit according to another embodiment.

FIG. 13 is a view illustrating a configuration example of a semiconductor integrated circuit according to another embodiment. The semiconductor integrated circuit includes a first IP core 300 and a second IP core 310. The first IP core 300 includes, other than the voltage-controlled oscillator 401, the phase frequency detector 402, the charge pump 403, the frequency divider 404, and the low-pass filter 1001, control lines A1 to A4 and A11 to A14, and switches 1301 and 1302. A first low-pass filter line La1 and a second low-pass filter line La2 are connected to the low-pass filter 1001.

The second IP core 310 includes a control block 1303, a first capacitor block group 1306, and a second capacitor block group 1307. The control block 1303 includes a first selection circuit 1304, and a second selection circuit 1305. The first capacitor block group 1306 includes a plurality of capacitor blocks BA1 to BAn. The second capacitor block group 1307 includes a plurality of capacitor blocks BB1 to BBn. The first capacitor block group 1306 and the second capacitor block group 1307 are connected to the first low-pass filter line La1 and the second low-pass filter line La2.

Each of the capacitor blocks BA1 to BAn and BB1 to BBn includes p-channel field-effect transistors 1308 to 1311, and a capacitor element 1312. The p-channel field-effect transistor 1308 has a source connected to the first low-pass filter line La1, and a drain connected to the ground potential node via the capacitor element 1312. The p-channel field-effect transistor 1309 has a source connected to the second low-pass filter line La2, and a drain connected to the ground potential node via the capacitor element 1312. The p-channel field-effect transistor 1310 has a source connected to the power supply voltage node Vdd1 of the phase locked loop circuit, and a drain connected to the ground potential node via the capacitor element 1312. The p-channel field-effect transistor 1311 has a source connected to the power supply voltage node Vdd2 of the internal circuit 311, and a drain connected to the ground potential node via the capacitor element 1312.

The capacitor elements 1312 in the capacitor blocks BA1 to BAn have capacitance values each being an exponentiation of 2, the capacitance values being increased in the order of the capacitor blocks BA1 to BAn. For example, the capacitance value of the capacitor element 1312 in the capacitor block BA1 is $2^0=1$ [pF]. The capacitance value of the capacitor element 1312 in the capacitor block BA2 is $2^1=2$ [pF]. The capacitance value of the capacitor element 1312 in the capacitor block BA3 is $2^2=4$ [pF]. The capacitance value of the capacitor element 1312 in the capacitor block BAn is $2^{n-1}$ [pF].

In like manner, the capacitor elements 1312 in the capacitor blocks BB1 to BBn have capacitance values each being an exponentiation of 2, the capacitance values being increased in the order of the capacitor blocks BB1 to BBn. For example, the capacitance value of the capacitor element 1312 in the capacitor block BB1 is $2^0=1$ [pF]. The capacitance value of the capacitor element 1312 in the capacitor block BB2 is $2^1=2$ [pF]. The capacitance value of the capacitor element 1312 in the capacitor block BB3 is $2^2=4$ [pF]. The capacitance value of the capacitor element 1312 in the capacitor block BBn is $2^{n-1}$ [pF].

The switch 1301 outputs connection destination control signals indicating a connection destination of the capacitor elements 1312 in the first capacitor block group 1306. The capacitor elements 1312 in the first capacitor block group 1306 are connected to, in accordance with the connection destination control signals output by the switch 1301, the first low-pass filter line La1, the second low-pass filter line La2, or the power supply voltage node Vdd1 or Vdd2.

To the control lines A1 to A4, a capacitance control signal indicating a capacitance value of the capacitor element 1312 to be connected, in the first capacitor block group 1306, is externally supplied. In the capacitor elements 1312 in the first capacitor block group 1306, the capacitor element 1312 having the capacitance value indicated by the capacitance control signal of the control lines A1 to A4 is connected to the connection destination.

The first selection circuit 1304 controls a gate voltage of each of the p-channel field-effect transistors 1308 to 1311 in the capacitor blocks BA1 to BAn, to make the capacitor element 1312 having the capacitance value indicated by the capacitance control signal of the control lines A1 to A4, out of the capacitor elements 1312 in the plurality of capacitor blocks BA1 to BAn, connect to any one of the first low-pass filter line La1, the second low-pass filter line La2, and the power supply voltage node Vdd1 or Vdd2, in accordance with the connection destination control signals of the switch 1301.

FIG. 14 is a view illustrating an input-output relation of a binary-to-decimal converter in the first selection circuit 1304. Connection destination control signals D1 and D2 are output signals of the switch 1301. When the connection destination control signals D1 and D2 are "00", output signals E1 to E4 become "0001", and the connection destination becomes the first low-pass filter line La1. In this case, the p-channel field-effect transistors 1308 can be turned on, and the p-channel field-effect transistors 1309 to 1311 are turned off.

Further, when the connection destination control signals D1 and D2 are "01", the output signals E1 to E4 become "0010", and the connection destination becomes the second low-pass filter line La1. In this case, the p-channel field-effect transistors 1309 can be turned on, and the p-channel field-effect transistors 1308, 1310, and 1311 are turned off.

Further, when the connection destination control signals D1 and D2 are "10", the output signals E1 to E4 become "0100", and the connection destination becomes the power supply voltage node Vdd1. In this case, the p-channel field-effect transistors 1310 can be turned on, and the p-channel field-effect transistors 1308, 1309, and 1311 are turned off.

Further, when the connection destination control signals D1 and D2 are "11", the output signals E1 to E4 become "1000", and the connection destination becomes the power supply voltage node Vdd2. In this case, the p-channel field-effect transistors 1311 can be turned on, and the p-channel field-effect transistors 1308 to 1310 are turned off.

For example, when the connection destination control signals of the switch 1301 indicate the connection destination of the first low-pass filter line La1, in the first capacitor block group 1306, the p-channel field-effect transistors 1308 are turned on, and the p-channel field-effect transistors 1309 to 1311 are turned off. Consequently, the capacitor elements 1312 are connected between the first low-pass filter line La1 and the ground potential node, and function as the first low-pass filter of the phase locked loop circuit.

When the connection destination control signals of the switch 1301 indicate the connection destination of the second low-pass filter line La2, in the first capacitor block group 1306, the p-channel field-effect transistors 1309 are turned on, and the p-channel field-effect transistors 1308, 1310, and 1311 are turned off. Consequently, the capacitor elements 1312 are connected between the second low-pass filter line La2 and the ground potential node, and function as the second low-pass filter of the phase locked loop circuit.

When the connection destination control signals of the switch 1301 indicate the connection destination of the power supply voltage node Vdd1, in the first capacitor block group 1306, the p-channel field-effect transistors 1310 are turned on, and the p-channel field-effect transistors 1308, 1309, and 1311 are turned off. Consequently, the capacitor elements 1312 are connected between the power supply voltage node Vdd1 of the phase locked loop circuit and the ground potential node, and function as the bypass capacitor of the phase locked loop circuit.

When the connection destination control signals of the switch 1301 indicate the connection destination of the power supply voltage node Vdd2, in the first capacitor block group 1306, the p-channel field-effect transistors 1311 are turned on, and the p-channel field-effect transistors 1308 to 1310 are turned off. Consequently, the capacitor elements 1312 are connected between the power supply voltage node Vdd2 of the internal circuit 311 and the ground potential node, and function as the bypass capacitor of the internal circuit 311.

Next, an example of the capacitance control signal of the control lines A1 to A4 will be described. Here, a case in which the connection destination control signals of the switch 1301 indicate the first low-pass filter line La1, will be described as an example. For example, when the capacitance control signal of the control lines A1 to A4 indicates 1 [pF], the p-channel field-effect transistor 1308 in the capacitor block BA1 is turned on, and the p-channel filed-effect transistors 1308 in the capacitor blocks BA2 to BAn are turned off. Consequently, the capacitor element 1312 with 1 [pF] in the capacitor block BA1 is connected to the first low-pass filter line La1.

When the capacitance control signal of the control lines A1 to A4 indicates 2 [pF], the p-channel field-effect transistor 1308 in the capacitor block BA2 is turned on, and the p-channel filed-effect transistors 1308 in the capacitor blocks BA1, and BA3 to BAn are turned off. Consequently, the capacitor element 1312 with 2 [pF] in the capacitor block BA2 is connected to the first low-pass filter line La1.

When the capacitance control signal of the control lines A1 to A4 indicates 3 [pF], the p-channel field-effect transistors 1308 in the capacitor blocks BA1 and BA2 are turned on, and the p-channel filed-effect transistors 1308 in the capacitor blocks BA3 to BAn are turned off. Consequently, the capacitor element 1312 with 1 [pF] in the capacitor block BA1 and the capacitor element 1312 with 2 [pF] in the capacitor block BA2 are connected to the first low-pass filter line La1.

In a similar manner as described above, the switch 1302 outputs connection destination control signals indicating a connection destination of the capacitor elements 1312 in the second capacitor block group 1307. The capacitor elements 1312 in the second capacitor block group 1307 are connected to the first low-pass filter line La1, the second low-pass filter line La2, or the power supply voltage node Vdd1 or Vdd2, in accordance with the connection destination control signals output by the switch 1302.

To control lines A11 to A14, a capacitance control signal indicating a capacitance value of the capacitor element 1312 to be connected, in the second capacitor block group 1307, is externally supplied. In the capacitor elements 1312 in the second capacitor block group 1307, the capacitor element 1312 having the capacitance value indicated by the capacitance control signal of the control lines A11 to A14 is connected to the connection destination.

The second selection circuit 1305 controls a gate voltage of each of the p-channel field-effect transistors 1308 to 1311 in the capacitor blocks BB1 to BBn, to make the capacitor element 1312 having the capacitance value indicated by the capacitance control signal of the control lines A11 to A14, out of the capacitor elements 1312 in the plurality of capacitor blocks BB1 to BBn, connect to any one of the first low-pass filter line La1, the second low-pass filter line La2, and the power supply voltage node Vdd1 or Vdd2, in accordance with the connection destination control signals of the switch 1302.

For example, when the connection destination control signals of the switch 1302 indicate the connection destination of the first low-pass filter line La1, in the second capacitor block group 1307, the p-channel field-effect transistors 1308 are turned on, and the p-channel field-effect transistors 1309 to 1311 are turned off. Consequently, the capacitor elements 1312 are connected between the first low-pass filter line La1 and the ground potential node, and function as the first low-pass filter of the phase locked loop circuit.

When the connection destination control signals of the switch 1302 indicate the connection destination of the second low-pass filter line La2, in the second capacitor block group 1307, the p-channel field-effect transistors 1309 are turned on, and the p-channel field-effect transistors 1308, 1310, and 1311 are turned off. Consequently, the capacitor elements 1312 are connected between the second low-pass filter line La2 and the ground potential node, and function as the second low-pass filter of the phase locked loop circuit.

When the connection destination control signals of the switch 1302 indicate the connection destination of the power supply voltage node Vdd1, in the second capacitor block group 1307, the p-channel field-effect transistors 1310 are turned on, and the p-channel field-effect transistors 1308, 1309, and 1311 are turned off. Consequently, the capacitor elements 1312 are connected between the power supply voltage node Vdd1 of the phase locked loop circuit and the ground potential node, and function as the bypass capacitor of the phase locked loop circuit.

When the connection destination control signals of the switch 1302 indicate the connection destination of the power supply voltage node Vdd2, in the second capacitor block group 1307, the p-channel field-effect transistors 1311 are turned on, and the p-channel field-effect transistors 1308 to 1310 are turned off. Consequently, the capacitor elements 1312 are connected between the power supply voltage node Vdd2 of the internal circuit 311 and the ground potential node, and function as the bypass capacitor of the internal circuit 311.

Next, an example of the capacitance control signal of the control lines A11 to A14 will be described. Here, a case in which the connection destination control signals of the switch 1302 indicate the first low-pass filter line La1, will be described as an example. For example, when the capacitance control signal of the control lines A11 to A14 indicates 1 [pF], the p-channel field-effect transistor 1308 in the capacitor block BB1 is turned on, and the p-channel filed-effect transistors 1308 in the capacitor blocks BB2 to BBn are turned off. Consequently, the capacitor element 1312 with 1 [pF] in the capacitor block BB1 is connected to the first low-pass filter line La1.

When the capacitance control signal of the control lines A11 to A14 indicates 2 [pF], the p-channel field-effect transistor 1308 in the capacitor block BB2 is turned on, and the p-channel filed-effect transistors 1308 in the capacitor blocks BB1, and BB3 to BBn are turned off. Consequently, the capacitor element 1312 with 2 [pF] in the capacitor block BB2 is connected to the first low-pass filter line La1.

When the capacitance control signal of the control lines A11 to A14 indicates 3 [pF], the p-channel field-effect transistors 1308 in the capacitor blocks BB1 and BB2 are turned on, and the p-channel filed-effect transistors 1308 in the capacitor blocks BB3 to BBn are turned off. Consequently, the capacitor element 1312 with 1 [pF] in the capacitor block BB1 and the capacitor element 1312 with 2 [pF] in the capacitor block BB2 are connected to the first low-pass filter line La1.

Note that in the capacitor block which is not designated by the capacitance control signal of the control lines A1 to A4 and A11 to A14, in the capacitor blocks BA1 to BAn and BB1 to BBn, it is also possible to design such that all of the p-channel field-effect transistors 1308 to 1311 are turned off, or the p-channel field-effect transistor 1311 is turned on and the p-channel field-effect transistors 1308 to 1310 are turned off. When the p-channel field-effect transistor 1311 is turned on, it is possible to connect the capacitor element 1312 to the power supply voltage node Vdd2 of the internal circuit 311.

Further, there is no need to arrange the capacitor blocks BA1 to BAn in the order of the capacitance value. The same applies to the capacitor blocks BB1 to BBn.

As described above, the p-channel field-effect transistors 1308 to 1311 configure a switch circuit, and connect the capacitor element 1312 in accordance with the capacitance control signal of the control lines A1 to A4 and the like, out of the capacitor elements 1312 in the plurality of capacitor blocks BA1 to BAn and the like, to any one of the first low-pass filter line La1, the second low-pass filter line La2, and the power supply voltage node Vdd1 or Vdd2, in accordance with the connection destination control signals of the switch 1301 and the like.

When the switch control signals of the switch 1301 and the like are in a first state ("11"), the p-channel field-effect transistor 1311 connects the capacitor element 1312 to the power supply voltage node Vdd2 of the internal circuit 311 as the bypass capacitor.

When the switch control signals of the switch 1301 and the like are in a second state ("00" and "01"), the p-channel field-effect transistors 1308 and 1309 respectively connect the capacitor element 1312 to the control voltage terminal of the voltage-controlled oscillator 401 as the low-pass filter.

When the switch control signals of the switch 1301 and the like are in a third state ("10"), the p-channel field-effect transistor 1310 connects the capacitor element 1312 to the power supply voltage node Vdd1 of the phase locked loop circuit as the bypass capacitor.

Figure 15:
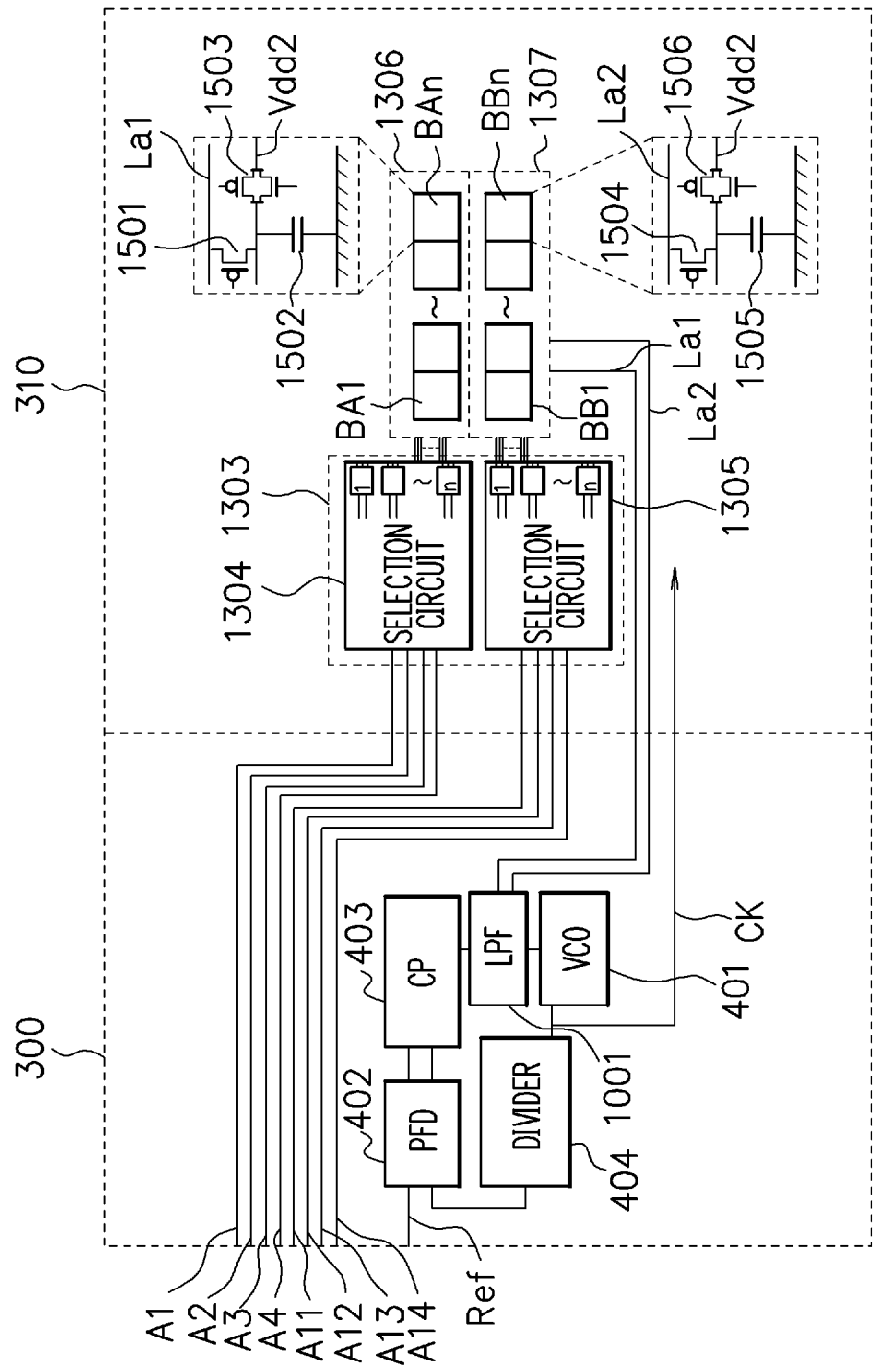
FIG. 15 is a view illustrating a configuration example of a semiconductor integrated circuit according to another embodiment.

FIG. 15 is a diagram illustrating a configuration example of a semiconductor integrated circuit according to another embodiment. The semiconductor integrated circuit includes a first IP core 300 and a second IP core 310. The first IP core 300 corresponds to the first IP core 300 in FIG. 13 from which the switches 1301 and 1302 are deleted. The second IP core 310 corresponds to the second IP core 310 in FIG. 13 with different internal configuration of the capacitor blocks BA1 to BAn and BB1 to BBn. Hereinafter, a point at which FIG. 15 differs from FIG. 13 will be described.

Each of capacitor blocks BA1 to BAn includes a p-channel field-effect transistor 1501, a capacitor element 1502, and a CMOS switch 1503. The p-channel field-effect transistor 1501 has a source connected to the first low-pass filter line La1, and a drain connected to the ground potential node via the capacitor element 1502. The CMOS switch 1503 is connected between the capacitor element 1502 and the power supply voltage node Vdd2. Specifically, the capacitor blocks BA1 to BAn are capacitors for the first low-pass filter of the phase locked loop circuit or the bypass capacitor of the internal circuit 311.

The capacitor elements 1502 in the capacitor blocks BA1 to BAn have capacitance values each being an exponentiation of 2, the capacitance values being increased in the order of the capacitor blocks BA1 to BAn. For example, the capacitance value of the capacitor element 1502 in the capacitor block BA1 is $2^0=1$ [pF]. The capacitance value of the capacitor element 1502 in the capacitor block BA2 is $2^1=2$ [pF]. The capacitance value of the capacitor element 1502 in the capacitor block BA3 is $2^2=4$ [pF]. The capacitance value of the capacitor element 1502 in the capacitor block BAn is $2^{n-1}$ [pF].

Each of capacitor blocks BB1 to BBn includes a p-channel field-effect transistor 1504, a capacitor element 1505, and a CMOS switch 1506. The p-channel field-effect transistor 1504 has a source connected to the second low-pass filter line La2, and a drain connected to the ground potential node via the capacitor element 1505. The CMOS switch 1506 is connected between the capacitor element 1505 and the power supply voltage node Vdd2. Specifically, the capacitor blocks BB1 to BBn are capacitors for the second low-pass filter of the phase locked loop circuit or the bypass capacitor of the internal circuit 311.

The capacitor elements 1505 in the capacitor blocks BB1 to BBn have capacitance values each being an exponentiation of 2, the capacitance values being increased in the order of the capacitor blocks BB1 to BBn. For example, the capacitance value of the capacitor element 1505 in the capacitor block BB1 is $2^0=1$ [pF]. The capacitance value of the capacitor element 1505 in the capacitor block BB2 is $2^1=2$ [pF]. The capacitance value of the capacitor element 1505 in the capacitor block BB3 is $2^2=4$ [pF]. The capacitance value of the capacitor element 1505 in the capacitor block BBn is $2^{n-1}$ [pF].

The first selection circuit 1304 controls on or off of each of the p-channel field-effect transistors 1501 and the CMOS switches 1503 in the capacitor blocks BA1 to BAn, to make the capacitor element 1502 having the capacitance value in accordance with the capacitance control signal of the control lines A1 to A4, out of the capacitor elements 1502 in the plurality of capacitor blocks BA1 to BAn, connect to the first low-pass filter line La1.

For example, when the capacitance control signal of the control lines A1 to A4 indicates 1 [pF], the p-channel field-effect transistor 1501 in the capacitor block BA1 is turned on, the CMOS switch 1503 in the capacitor block BA1 is turned off, the p-channel filed-effect transistors 1501 in the capacitor blocks BA2 to BAn are turned off, and the CMOS switches 1503 in the capacitor blocks BA2 to BAn are turned on. Consequently, the capacitor element 1502 with 1 [pF] in the capacitor block BA1 is connected to the first low-pass filter line La1, and the capacitor elements 1502 in the capacitor blocks BA2 to BAn are connected to the power supply voltage node Vdd2 of the internal circuit 311.

When the capacitance control signal of the control lines A1 to A4 indicates 2 [pF], the p-channel field-effect transistor 1501 in the capacitor block BA2 is turned on, the CMOS switch 1503 in the capacitor block BA2 is turned off, the p-channel filed-effect transistors 1501 in the capacitor blocks BA1, and BA3 to BAn are turned off, and the CMOS switches 1503 in the capacitor blocks BA1, and BA3 to BAn are turned on. Consequently, the capacitor element 1502 with 2 [pF] in the capacitor block BA2 is connected to the first low-pass filter line La1, and the capacitor elements 1502 in the capacitor blocks BA1, and BA3 to BAn are connected to the power supply voltage node Vdd2 of the internal circuit 311.

The second selection circuit 1305 controls on or off of each of the p-channel field-effect transistors 1504 and the CMOS switches 1506 in the capacitor blocks BB1 to BBn, to make the capacitor element 1505 having the capacitance value indicated by the capacitance control signal of the control lines A11 to A14, out of the capacitor elements 1505 in the plurality of capacitor blocks BB1 to BBn, connect to the second low-pass filter line La2.

For example, when the capacitance control signal of the control lines A11 to A14 indicates 1 [pF], the p-channel field-effect transistor 1504 in the capacitor block BB1 is turned on, the CMOS switch 1506 in the capacitor block BB1 is turned off, the p-channel filed-effect transistors 1504 in the capacitor blocks BB2 to BBn are turned off, and the CMOS switches 1506 in the capacitor blocks BB2 to BBn are turned on. Consequently, the capacitor element 1505 with 1 [pF] in the capacitor block BB1 is connected to the second low-pass filter line La2, and the capacitor elements 1505 in the capacitor blocks BB2 to BBn are connected to the power supply voltage node Vdd2 of the internal circuit 311.

When the capacitance control signal of the control lines A11 to A14 indicates 2 [pF], the p-channel field-effect transistor 1504 in the capacitor block BB2 is turned on, the CMOS switch 1506 in the capacitor block BB2 is turned off, the p-channel filed-effect transistors 1504 in the capacitor blocks BB1, and BB3 to BBn are turned off, and the CMOS switches 1506 in the capacitor blocks BB1, and BB3 to BBn are turned on. Consequently, the capacitor element 1505 with 2 [pF] in the capacitor block BB2 is connected to the second low-pass filter line La2, and the capacitor elements 1505 in the capacitor blocks BB1, and BB3 to BBn are connected to the power supply voltage node Vdd2 of the internal circuit 311.

As described above, out of the capacitor elements 1502 in the capacitor blocks BA1 to BAn, the capacitor element 1502 with the capacitance value indicated by the capacitance control signal of the control lines A1 to A4 is connected to the first low-pass filter line La1, and the rest of the capacitor elements 1502 are connected to the power supply voltage node Vdd2 of the internal circuit 311.

Further, out of the capacitor elements 1505 in the capacitor blocks BB1 to BBn, the capacitor element 1505 with the capacitance value indicated by the capacitance control signal of the control lines A11 to A14 is connected to the second low-pass filter line La2, and the rest of the capacitor elements 1505 are connected to the power supply voltage node Vdd2 of the internal circuit 311.

Further, in like manner, it is possible to provide capacitor blocks in which a capacitor element with a capacitance value indicated by the capacitance control signal is connected to the power supply voltage node Vdd1 of the phase locked loop circuit, and the rest of the capacitor elements are connected to the power supply voltage node Vdd2 of the internal circuit 311.

The p-channel field-effect transistors 1501 and the CMOS switches 1503 configure a switch circuit, in which they connect the capacitor element 1502 in accordance with the capacitance control signal, out of the capacitor elements 1502 in the plurality of capacitor blocks BA1 to BAn to the first low-pass filter line La1 of the phase locked loop circuit, and connect the rest of the capacitor elements 1502 to the power supply voltage node Vdd2 of the internal circuit 311.

Further, the p-channel field-effect transistors 1504 and the CMOS switches 1506 configure a switch circuit, in which they connect the capacitor element 1505 in accordance with the capacitance control signal, out of the capacitor elements 1505 in the plurality of capacitor blocks BB1 to BBn to the second low-pass filter line La2 of the phase locked loop circuit, and connect the rest of the capacitor elements 1505 to the power supply voltage node Vdd2 of the internal circuit 311.

According to the above-described plural embodiments, even if there is no capacitor element formed in the first IP core (phase locked loop circuit) 300, it is possible to utilize the capacitor element formed in the dead space of the second IP core (processing circuit) 310 as the capacitor element (LPF) which is necessary for generating clock of the phase locked loop circuit, so that the size of the semiconductor integrated circuit can be reduced by effectively utilizing the dead space in the semiconductor integrated circuit.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

By providing a capacitor in a dead space, it is possible to reduce an entire area by effectively utilizing the dead space.

What is claimed is:

1. A semiconductor integrated circuit, comprising:
   a phase locked loop circuit configured to output a clock signal;
   an internal circuit configured to execute processing;
   a capacitor; and
   a switch circuit configured to connect the capacitor to the internal circuit when a switch control signal is in a first state and to connect the capacitor to the phase locked loop circuit when the switch control signal is in a second state.

2. The semiconductor integrated circuit according to claim 1, wherein:
   the phase locked loop circuit includes a voltage-controlled oscillator configured to generate the clock signal with a frequency in accordance with a voltage of a control voltage terminal; and
   the switch circuit connects the capacitor to a power supply voltage node of the internal circuit, as a bypass capacitor, when the switch control signal is in the first state, and the switch circuit connects the capacitor to the control voltage terminal of the voltage-controlled oscillator, as a low-pass filter, when the switch control signal is in the second state.

3. The semiconductor integrated circuit according to claim 1, wherein the switch circuit connects the capacitor to a power supply voltage node of the internal circuit, as a bypass capacitor, when the switch control signal is in the first state, and the switch circuit connects the capacitor to a power supply voltage node of the phase locked loop circuit, as a bypass capacitor, when the switch control signal is in the second state.

4. The semiconductor integrated circuit according to claim 1, wherein:
   the phase locked loop circuit includes a voltage-controlled oscillator configured to generate the clock signal with a frequency in accordance with a voltage of a control voltage terminal;
   the capacitor includes a first capacitor element and a second capacitor element;
   and
   the switch circuit includes a first switch element and a second switch element, wherein:
   the first switch element connects the first capacitor element to a power supply voltage node of the internal circuit, as a bypass capacitor, when the first switch control signal is in the first state, and the first switch element connects the first capacitor element to the control voltage terminal of the voltage-controlled oscillator, as a low-pass filter, when the first switch control signal is in the second state; and
   the second switch element connects the second capacitor element to the power supply voltage node of the internal circuit, as the bypass capacitor, when a second switch control signal is in a third state, and the second switch element connects the second capacitor element to a power supply voltage node of the phase locked loop circuit, as a bypass capacitor, when the second switch control signal is in a fourth state.

5. The semiconductor integrated circuit according to claim 1, wherein:
the phase locked loop circuit includes a voltage-controlled oscillator configured to generate the clock signal with a frequency in accordance with a voltage of a control voltage terminal; and
the switch circuit connects the capacitor to a power supply voltage node of the internal circuit, as a bypass capacitor, when the switch control signal is in the first state, the switch circuit connects the capacitor to the control voltage terminal of the voltage-controlled oscillator, as a low-pass filter, when the switch control signal is in the second state, and the switch circuit connects the capacitor to a power supply voltage node of the phase locked loop circuit, as a bypass capacitor, when the switch control signal is in a third state.

6. The semiconductor integrated circuit according to claim 1, wherein:
the capacitor includes a plurality of capacitor elements; and
the switch circuit connects plural capacitor elements that are continuously provided out of the plurality of capacitor elements to the phase locked loop circuit in a chain state, and connects the rest of the capacitor elements to the internal circuit, in accordance with the switch control signal.

7. The semiconductor integrated circuit according to claim 1, wherein:
the capacitor includes a plurality of capacitor elements, wherein
the plurality of capacitor elements include controllable capacitor elements and uncontrollable capacitor elements which are fixedly connected to the internal circuit;
the semiconductor integrated circuit further comprises a detection circuit configured to detect a number of the controllable capacitor elements out of the plurality of capacitor elements based on an initial state of the switch control signal of the switch circuit; and
the switch circuit connects a first number of the capacitor elements out of the controllable capacitor elements, to the phase locked loop circuit, the first number being a number corresponding to a designated ratio of the number of the controllable capacitor elements detected by the detection circuit, and connects the rest of the capacitor elements to the internal circuit.

8. The semiconductor integrated circuit according to claim 1, wherein:
the capacitor includes a plurality of capacitor elements; and
the switch circuit connects a capacitor element according to a capacitance control signal out of the plurality of capacitor elements to the phase locked loop circuit, and connects the rest of the capacitor elements to the internal circuit.

9. The semiconductor integrated circuit according to claim 1, wherein:
the capacitor includes a plurality of capacitor elements; and
the switch circuit connects a capacitor element according to a capacitance control signal out of the plurality of capacitor elements to either of the phase locked loop circuit and the internal circuit, in accordance with a connection destination control signal.

10. A processing circuit, comprising:
an internal circuit configured to execute processing;
a capacitor; and
a switch circuit configured to connect the capacitor to the internal circuit when a switch control signal is in a first state and to connect the capacitor to a phase locked loop circuit when the switch control signal is in a second state.

11. The processing circuit according to claim 10, wherein the switch circuit connects the capacitor to a power supply voltage node of the internal circuit, as a bypass capacitor, when the switch control signal is in the first state, and the switch circuit connects the capacitor to a control voltage terminal of a voltage-controlled oscillator in the phase locked loop circuit, as a low-pass filter, when the switch control signal is in the second state.

12. The processing circuit according to claim 10, wherein the switch circuit connects the capacitor to a power supply voltage node of the internal circuit, as a bypass capacitor, when the switch control signal is in the first state, and the switch circuit connects the capacitor to a power supply voltage node of the phase locked loop circuit, as a bypass capacitor, when the switch control signal is in the second state.

13. The processing circuit according to claim 10, wherein:
the capacitor includes a first capacitor element and a second capacitor element; and
the switch circuit includes a first switch element and a second switch element, wherein:
the first switch element connects the first capacitor element to a power supply voltage node of the internal circuit, as a bypass capacitor, when a first switch control signal is in the first state, and the first switch element connects the first capacitor elements to a control voltage terminal of a voltage-controlled oscillator in the phase locked loop circuit, as a low-pass filter, when the first switch control signal is in the second state; and
the second switch element connects the second capacitor element to the power supply voltage node of the internal circuit, as the bypass capacitor, when a second switch control signal is in a third state, and the second switch element connects the second capacitor element to a power supply voltage node of the phase locked loop circuit, as a bypass capacitor, when the second switch control signal is in a fourth state.

14. The processing circuit according to claim 10, wherein:
the switch circuit connects the capacitor to a power supply voltage node of the internal circuit, as a bypass capacitor, when the switch control signal is in the first state, the switch circuit connects the capacitor to a control voltage terminal of a voltage-controlled oscillator in the phase locked loop circuit, as a low-pass filter, when the switch control signal is in the second state, and the switch circuit connects the capacitor to a power supply voltage node of the phase locked loop circuit, as a bypass capacitor, when the switch control signals are in a third state.

15. The processing circuit according to claim 10, wherein:
the capacitor includes a plurality of capacitor elements; and
the switch circuit connects plural capacitor elements that are continuously provided out of the plurality of capacitor elements to the phase locked loop circuit in a chain state, and connects the rest of the capacitor elements to the internal circuit, in accordance with the switch control signal.

16. The processing circuit according to claim 10, wherein:

the capacitor includes a plurality of capacitor elements, wherein the plurality of capacitor elements include controllable capacitor elements and uncontrollable capacitor elements which are fixedly connected to the internal circuit;

the semiconductor integrated circuit further comprises a detection circuit configured to detect a number of the controllable capacitor elements out of the plurality of capacitor elements based on an initial state of the switch control signal of the switch circuit; and the switch circuit connects a first number of the capacitor elements out of the controllable capacitor elements, to the phase locked loop circuit, the first number being a number corresponding to a designated ratio of the number of the controllable capacitor elements detected by the detection circuit, and connects the rest of the capacitor elements to the internal circuit.

17. The processing circuit according to claim 10, wherein:

the capacitor includes a plurality of capacitor elements; and the switch circuit connects a capacitor element according to a capacitance control signal out of the plurality of capacitor elements to the phase locked loop circuit, and connects the rest of the capacitor elements to the internal circuit.

18. The processing circuit according to claim 10, wherein:

the capacitor includes a plurality of capacitor elements; and the switch circuit connects a capacitor element according to a capacitance control signal out of the plurality of capacitor elements to either of the phase locked loop circuit and the internal circuit, in accordance with a connection destination control signal.

\* \* \* \* \*